US012685188B2

(12) United States Patent
Lamar et al.

(10) Patent No.: US 12,685,188 B2
(45) Date of Patent: Jul. 14, 2026

(54) MULTI-DIE INTEGRATED CIRCUIT DEVICE WITH A SPARK GAP

(71) Applicant: Allegro MicroSystems, LLC, Manchester, NH (US)

(72) Inventors: Washington Lamar, Mont Vernon, NH (US); Weidong Wang, Westford, MA (US); Maxim Klebanov, Palm Coast, FL (US); Sagar Saxena, Manchester, NH (US); Yash Shaileshbhai Patel, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 409 days.

(21) Appl. No.: 18/429,509

(22) Filed: Feb. 1, 2024

(65) Prior Publication Data

US 2025/0253284 A1     Aug. 7, 2025

(51) Int. Cl.
| | |
|---|---|
| *H10W 70/40* | (2026.01) |
| *H10W 42/60* | (2026.01) |
| *H10W 42/80* | (2026.01) |
| *H10W 72/00* | (2026.01) |
| *H10W 74/00* | (2026.01) |
| *H10W 74/10* | (2026.01) |
| *H10W 90/00* | (2026.01) |

(52) U.S. Cl.
CPC ......... *H10W 70/465* (2026.01); *H10W 42/60* (2026.01); *H10W 42/80* (2026.01); *H10W 70/40* (2026.01); *H10W 70/424* (2026.01); *H10W 74/111* (2026.01); *H10W 90/00* (2026.01); *H10W 90/811* (2026.01); *H10W*

*72/871* (2026.01); *H10W 74/00* (2026.01); *H10W 90/753* (2026.01); *H10W 90/754* (2026.01); *H10W 90/762* (2026.01); *H10W 90/763* (2026.01)

(58) Field of Classification Search
CPC ..... H10W 42/60; H10W 42/80; H10W 70/40; H10W 70/421–429; H10W 74/00; H10W 74/111; H10W 90/00; H10W 90/811
See application file for complete search history.

(56) References Cited

U.S. PATENT DOCUMENTS

| | | | |
|---|---|---|---|
| 9,941,224 B2 | 4/2018 | Lamar et al. | |
| 10,145,904 B2 | 12/2018 | Klebanov et al. | |
| 10,147,688 B2 | 12/2018 | Wilkinson et al. | |
| 10,147,689 B2 * | 12/2018 | Lamar .................... | H10W 42/60 |
| 11,664,334 B2 * | 5/2023 | Djemour ............... | H10W 42/60 |
| | | | 361/54 |

OTHER PUBLICATIONS

U.S. Appl. No. 18/752,924, filed Jun. 25, 2024, Klebanov, et al.

* cited by examiner

*Primary Examiner* — Jose R Diaz
(74) *Attorney, Agent, or Firm* — DALY, CROWLEY, MOFFORD & DURKEE, LLP

(57) ABSTRACT

An integrated circuit package having more than one semiconductor die includes a spark gap to provide a current path designed to protect the device. The spark gap can be provided between an exposed portion of a corner lead and an exposed portion of a tie bar and/or between exposed portions of adjacent leads. The spark gap distance is designed to achieve required ratings for a given application. Stacked and side-by-side die configurations are described.

19 Claims, 5 Drawing Sheets

MULTI-DIE INTEGRATED CIRCUIT DEVICE WITH A SPARK GAP

BACKGROUND

Electronic devices sometimes operate in environments that can damage the components and devices. Installation of a device in an automobile, for example, can expose electronic devices to stress conditions that can cause damage to the part. Also, static charge that has built up can transfer to the electronic device during handling, installation, or inspection. Devices can also be damaged by interruptions or fluctuations in power to which the device is connected.

In electronic devices containing more than one semiconductor die, the die are generally electrically isolated from each other. Unpredictable discharge paths can result from such galvanic isolation that can cause electrical current to arc between the die and potentially damage the electronic device. For example, discharge paths can include pin-to-pin arcing and/or dielectric breakdown of mold compound and/ or die attach adhesive.

For example, electronic devices may be subject to electrical overstress ("EOS") conditions such as an electrostatic discharge ("ESD") event occurring between exposed pins or leads of the device. These events can occur if there is a system fault or if the electronic device is exposed to an external charge. For example, the human body can store a charge that can correlate to a voltage as high as 25 kV. If a charged body touches an external lead of the electronic device, that charge can be transferred to and potentially damage the device. During manufacturing, devices generally undergo human-body model (HBM) testing to characterize susceptibility of the device to damage from ESD. Many devices contain ESD protection circuits that provide paths for current due to ESD events to flow without damaging the internal circuitry of the device.

SUMMARY

The present disclosure is directed to circuits and methods for providing a spark gap in a multi-die integrated circuit package. The spark gap can be provided between an exposed portion of a corner lead and an exposed portion of a tie bar and/or between exposed portions of adjacent leads. The spark gap distance is designed to achieve required ratings for a given application.

According to the disclosure, apparatus includes a first die having a first power contact and a first ground contact, a second die having a second power contact and a second ground contact, and a lead frame including a die attach paddle having a tie bar and a plurality of leads, wherein the first ground contact is electrically coupled to the die attach paddle and the second ground contact is galvanically isolated from the die attach paddle. The apparatus further includes a package body enclosing the die attach paddle, the first die, and the second die, wherein the tie bar is exposed at a first side of the package body and each of the plurality of leads is exposed at a second side of the package body orthogonal to the first side. A corner lead of the plurality of leads is exposed at the first side of the package body to form a spark gap between the exposed portion of the corner lead and the exposed portion of the tie bar.

Features may include one or more of the following individually or in combination with other features. The distance between the exposed portion of the corner lead and the exposed portion of the tie bar along the first side of the package body is selected based on a predetermined voltage isolation. In embodiments, the tie bar is a first tie bar and the die attach paddle includes a second tie bar exposed at the first side of the package body, a third tie bar exposed at a third side of the package body opposite to the first side of the package body, and a fourth tie bar exposed at the third side of the package body. The plurality of leads can be a first plurality of leads and the apparatus can further include a second plurality of leads, each exposed at a fourth side of the package body opposite to the second side of the package body.

In embodiments, the apparatus can further include a first wire bond with which the first ground contact is electrically coupled to the die attach paddle and a second wire bond with which the first ground contact is electrically coupled to a lead of the plurality of leads. In embodiments, the apparatus can further include a first wire bond with which the first ground contact is electrically coupled to the die attach paddle, wherein the lead frame comprises a die attach paddle extension extending between the die attach paddle and a lead of the plurality of leads.

The first die can be attached to the die attach paddle and the second die can be attached to the first die in a stacked arrangement. The apparatus can further include a nonconductive adhesive between the first die and the die attach paddle and between the first die and the second die.

In embodiments, the second die can be attached to the die attach paddle and the first die is attached to the second die in a stacked configuration. In embodiments, the first die can be attached to the die attach paddle and the second die can be attached to the die attach paddle so that the first die and the second die are in a side-by-side configuration. The apparatus can further include a non-conductive adhesive between the first die and the die attach paddle and between the second die and the die attach paddle. The first die and the second die can be substantially identical.

At least one of the plurality of leads that is not electrically connected to the first die or to the second die can include a first portion enclosed by the package body and a second portion exposed outside of the package body, wherein the first portion is wider than the second portion to form a second spark gap to an adjacent lead of the plurality of leads. In some embodiments, the lead that is not electrically connected to the first die or to the second die can have a T-shape.

The corner lead can include a first portion formed from the lead frame material and a second tab portion extending from the first portion to the first side of the package body.

According to the disclosure, apparatus includes a first die having a first power contact and a first ground contact, a second die having a second power contact and a second ground contact, and a lead frame including a die attach paddle having a tie bar and a plurality of leads, wherein the first ground contact is electrically coupled to the die attach paddle and the second ground contact is galvanically isolated from the die attach paddle. The apparatus further includes a package body enclosing the die attach paddle, the first die, and the second die, wherein at least one of the plurality of leads that is not electrically connected to the first die or to the second die includes a first portion enclosed by the package body and a second portion exposed outside of the package body, and wherein the first portion is wider than the second portion to form a spark gap to an adjacent lead of the plurality of leads.

Features may include one or more of the following individually or in combination with other features. In embodiments, at least one lead can have a T-shape. The die attach paddle can include a tie bar exposed at a first side of the package body, each of the plurality of leads can be exposed at a second side of the package body orthogonal to the first side, and a corner lead of the plurality of leads can be exposed at the first side of the package body to form a spark gap between the exposed corner lead and the exposed tie bar.

Also described is a method for protecting a multi-die electronic device from electrostatic discharge including providing a lead frame with a die attach paddle, a tie bar, and a plurality of leads, attaching first and second die to the die attach paddle of the lead frame, electrically coupling a ground contact of the first die to the die attach paddle and galvanically isolating the second die from the first die, enclosing the first die, the second die, and the die attach paddle with a package body having a first side along where each of the plurality of leads is exposed and exposing the tie bar and a corner lead of the plurality of leads along a second side of the package body orthogonal to the first side.

BRIEF DESCRIPTION OF DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
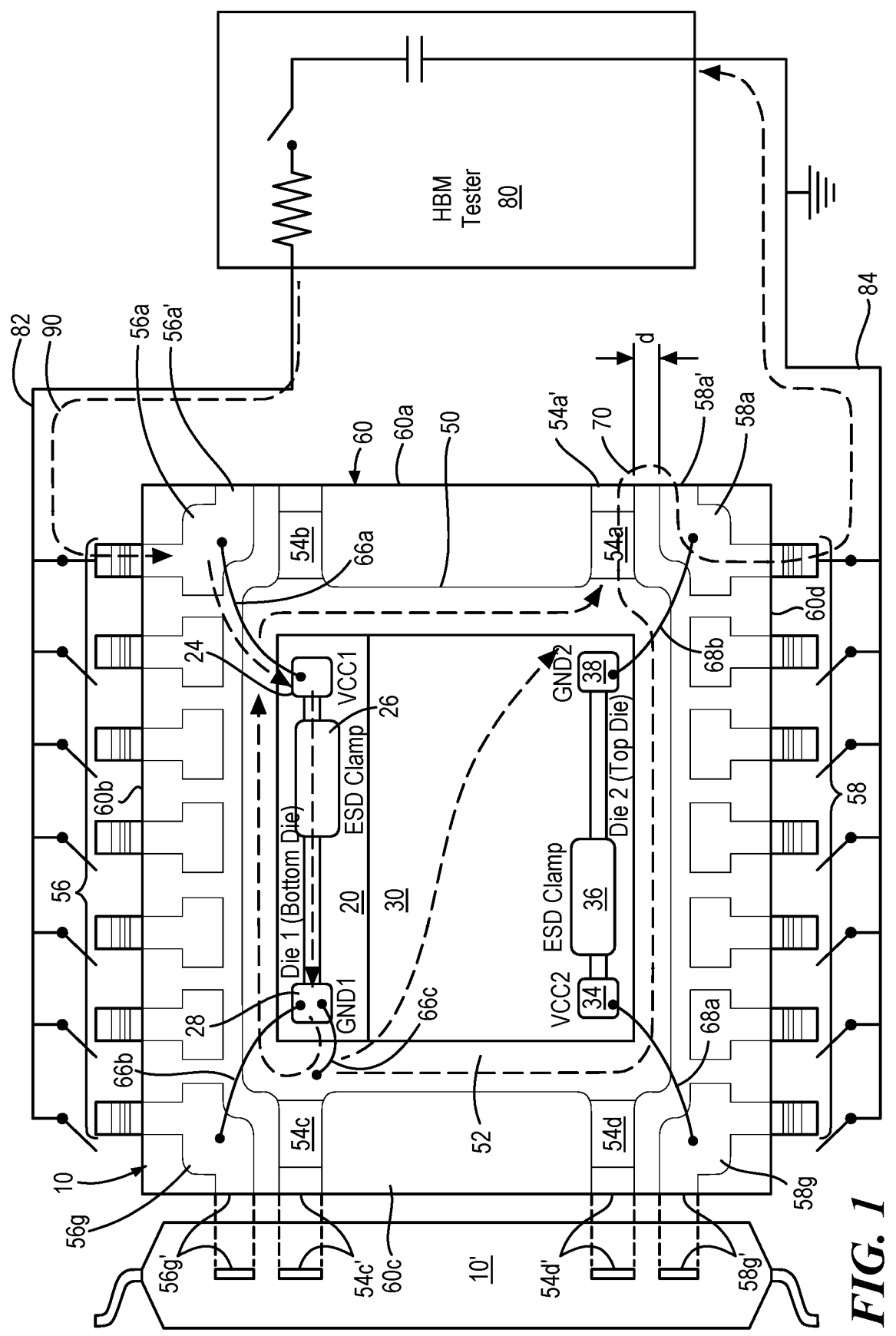
FIG. 1 is a plan view and a side view of a multi-die integrated circuit device including a spark gap according to the disclosure.

Referring to FIG. 1, a multi-die integrated circuit device 10 includes a first die 20 having a first power contact 24 and a first ground contact 28, a second die 30 having a second power contact 34 and a second ground contact 38, and a lead frame 50 including a die attach paddle 52 having a tie bar 54a and leads or pins 56, 58. The first ground contact 28 is electrically coupled to the die attach paddle 52 and the second ground contact 38 is galvanically isolated from the die attach paddle 52. More generally, the first and second die 20, 30 are electrically isolated from each other.

First die 20 can include an ESD protection device, such as an ESD clamp 26, coupled between its power and ground contacts 24, 28 and similarly, second die 30 can include an ESD protection device, such as an ESD clamp 36, coupled between its power and ground contacts 34, 38, as shown. ESD clamps 26, 36 can take various conventional forms. It will be appreciated by those of ordinary skill in the art that unpredictable conduction paths between die 20 and die 30 can result from the galvanic isolation between the die and, in particular, excess charge may occur during an ESD event, may bypass the protective ESD clamps 26, 36 and damage the device 10.

Device 10 includes wire bonds 66a, 66b, 66c with which electrical connection is made to the first die 20 and wire bonds 68a, 68b with which electrical connection is made to the second die 30. For example, wire bond 66a electrically connects the first power contact 24 to a lead 56a, wire bond 66b electrically connects first ground contact 28 to a lead 56g, and wire bond 66c electrically connects the first ground contact 28 to the die attach paddle 52, as shown. Further, wire bond 68a electrically connects the second power contact 34 to a lead 58g and wire bond 68b electrically connects the second ground contact 38 to a lead 58a. It will be appreciated by those of ordinary skill in the art that more or fewer wire bonds can be used to electrically connect die 20, 30 to leads 56, 58, respectively, as desired and suitable for the particular device and application.

Device 10 further includes a package body 60 enclosing the die attach paddle 52, the first die 20, and the second die 30. Package body 60 is comprised of an insulative material, such as a plastic mold material, and can have various form factors. In general, package body 60 has a first side 60a, a second side 60b orthogonal to the first side 60a, a third side 60c parallel to the first side 60a, and a fourth side 60d orthogonal to the first side 60a, as shown. One such package type is sometimes referred to as a so-called Thin Shrink Small Outline Package (i.e., TSSOP). It will be appreciated by those of ordinary skill in the art, however, that the concepts described herein are not limited to any particular package type or number or configuration of leads.

In the example device 10, each of the first plurality of leads 56 extends from the second side 60b of the package body 60 and each of the second plurality of leads 58 extends from the fourth side 60d of the package body. Terminal portions of leads 56, 58 are external to the package body 60 to permit electrical connection of the device 10 to external circuits and systems, such as by surface mount solder connection to pads on a printed circuit board or other suitable substrate.

Tie bar 54a is exposed at the first side 60a of the package body 60. Tie bars are often used in integrated circuit device fabrication to hold the lead frame 50 securely together with lead frames of other devices (not shown) which are fabricated from a single unitary lead frame sheet material and also to hold the lead frame stationary during the fabrication process. Once device 10 is fabricated, tie bar portions between adjacent devices are removed to "singulate" individual devices.

According to an aspect of the disclosure, a corner lead, such as corner lead 58a of the second plurality of leads 58, is further exposed at the first side 60a of the package body 60 (in addition to being exposed at the fourth side 60d of the package body), as shown. Corner lead 58a in conjunction with tie bar 54a form a spark gap 70 between the exposed portion 58a' of the corner lead 58a and the exposed portion 54a' of the tie bar 54a.

By "exposed" at a side of the package body 60, it means that the exposed element or portion (e.g., exposed portion 54a' of the tie bar 54a and exposed portion 58a' of the corner lead 58a) terminates at the side surface and can be accessed or contacted from outside of the side surface, as can occur upon singulation of the device 10 during manufacture. Thus, generally, the exposed element or portion is accessible from the side surface of the package body 60 but does not extend beyond the side surface of the package body.

In the context of the subject disclosure, "spark gap" refers to a space or gap external to the device package body 60 and between generally adjacent or proximate elements or element portions that is designed to allow a transient charge in the form of an electric spark to pass between the element portions. When the voltage potential between the exposed portions reaches a breakdown voltage of the ambient medium, such as air, current flows between the exposed portions and continues to flow until the voltage drops to below the breakdown voltage.

During testing, such as HBM testing as may be performed during manufacture, a tester 80 is selectively connected to device leads 56, 58 by a switchable positive connection 82 and negative or return connection 84 in order to test susceptibility of the device 10 to damage from ESD events. In other words, tester 80 is used to simulate an overvoltage condition, such as an ESD event.

In an illustrated testing example, a positive supply connection 82 is made from the tester 80 to lead 56a and a return connection is made to corner lead 58a. Under test, a high voltage is applied between connections 82, 84 causing a current conduction path (shown by a dotted line labeled 90) to be formed. Conduction path 90 permits current to flow into lead 56a, to the power contact 24, through the ESD clamp 26, out of the first ground connection 28 to the die attach paddle 52 (here through wire bond 66c). From the die attach paddle 52, current flows to the tie bar 54a, through the spark gap 70 (i.e., out of the exposed portion 54a' of tie bar 54a, through air external to the package body 60, and back into the package at adjacent exposed portion 58a' of corner lead 58a), through pin 58a, and back to the tester 80.

With this arrangement, a current path external to the integrated circuit device 10 is provided by the spark gap 70 through which current can flow under certain ESD types of conditions. Without the spark gap 70, current could flow internally to device 10 and potentially damage the device. In this way, spark gap 70 can prevent or reduce the chance of an electrical arc between the semiconductor die 20, 30, and thus prevent or reduce the chance of damage due to arcing or heat.

A distance "d" between the exposed portion 58a' of the corner lead 58a and the exposed portion 54a' of the tie bar 54a along the first side 60a of the package body 60 is designed or selected based on predetermined voltage isolation requirements. For example, the spark gap distance "d" between the exposed portion 58a' of the corner lead 58a and the exposed portion 54a' of the tie bar 54a can be selected to allow arc conduction for HBM levels as low as 500V. This spacing can be increased such that arcing will occur for HBM pulses greater than +/−2 kV. It will be appreciated by those of ordinary skill in the art that the larger the distance "d", the higher the applied voltage necessary to overcome the breakdown voltage of the gap so as to permit current to flow through the spark gap 70.

Additional corner leads of device 10 can include a corner lead 56a that has an exposed portion 56a' from the first side 60a of the package body 60, a corner lead 56g that has an exposed portion 56g' from the third side 60c of the package body 60, and a corner lead 58g that has an exposed portion 58g' from the third side 60c of the package body, as shown.

Tie bar 54a can be one of a plurality of tie bars. For example, the lead frame 50 can include a second tie bar 54b exposed at the first side 60a of the package body, a third tie bar 54c exposed at the third side 60c of the package body, and a fourth tie bar 54d exposed at the third side 60c of the package body, as shown.

Four tie bars 54a, 54b, 54c, 54d can be used in the example device 10 for ease of manufacturability and balance. Providing tie bars 54a, 54b, 54c, 54d adjacent to respective exposed portions 56a', 56g', 58a', 58g' of respective corner leads 56a, 56g, 58a, 58g provides flexibility in the device design to provide additional or alternative spark gaps (not labeled). For example, in order to test for an alternative ESD conduction path, the return connection 84 of tester 80 could be connected to corner pin 58g (rather than to corner pin 58a), in which case a spark gap (not labeled) is provided between the exposed portion 54d' of tie bar 54d and the exposed portion 58g' of corner lead 58g.

Also shown in FIG. 1 is a side view 10' of the device 10 from which the exposed portion 56g', 58g' of respective corner leads 56g, 58g and the exposed portion 54c', 54d' of respective tie bars 54c, 54d can be seen.

Device 10 can contain various electronic components and circuitry to implement various functionality, such as sensor functionality using one or more sensing elements, in combination with other circuits and elements. For example, device 10 can be a magnetic field sensor containing one or more magnetic field sensing elements. The magnetic field sensor can be, for example, a rotation detector, a movement detector, a proximity detector, or a position detector. A linear sensor can sense a magnetic field strength. A rotation detector (or movement detector) can sense passing target objects, for example, magnetic domains of a ring magnet or a ferromagnetic target (e.g., gear teeth) where the magnetic field sensor is used in combination with a back-bias or other magnet and can determine target movement speed and/or direction. Also, linear arrangements of ferromagnetic objects are possible that move linearly.

As noted, device 10 includes two semiconductor die 20, 30. Multiple die are sometimes provided in a single package for redundancy purposes, as can be required to meet certain safety requirements, such as ASIL requirements. Accordingly, the die 20, 30 may or may not be identical to each other. Identical circuits on die 20, 30 may act as redundant circuits so that, if one of the circuits malfunctions, the other may continue to operate. Such redundancy is sometimes referred to as homogeneous redundancy. In other embodiments, first and second die 20, 30 support different circuits that may perform the same or different functions and/or with the same or different methodologies and/or with the same or different accuracies. Such redundancy is sometimes referred to as heterogeneous redundancy. It will be appreciated by those of ordinary skill in the art that the devices described herein are not limited to any particular number or configuration of die with the device package.

Device 10 is configured with first die 20 mechanically secured to the die attach paddle 52 and second die 30 mechanically secured to the first die 20. To this end, a non-conductive, electrically insulative adhesive can be provided between the first die 20 and die attach paddle 52 and also between the first die 20 and the second die. Multi-die device 10 can be described as a "stacked" configuration of die 20, 30 in which the die vertically overlap one another.

It will be appreciated by those of ordinary skill in the art that the dual-die configuration of the device 10 shown in FIG. 1 can be varied while still benefiting from the advantages of a spark gap formed between a side-exposed tie bar and adjacent side-exposed corner lead. For example, while the embodiment of FIG. 1 has the first ground contact 28 of the first die 20 coupled to the die attach paddle 52 by a wire bond 66c, alternatively the lead frame 50 can have the die attach paddle integrally formed with a lead (i.e., a unitary die attach paddle and lead) and a direct ground connection can be made from the ground contact of the die to the die attach paddle and integral lead as shown in FIG. 2.

Figure 2:
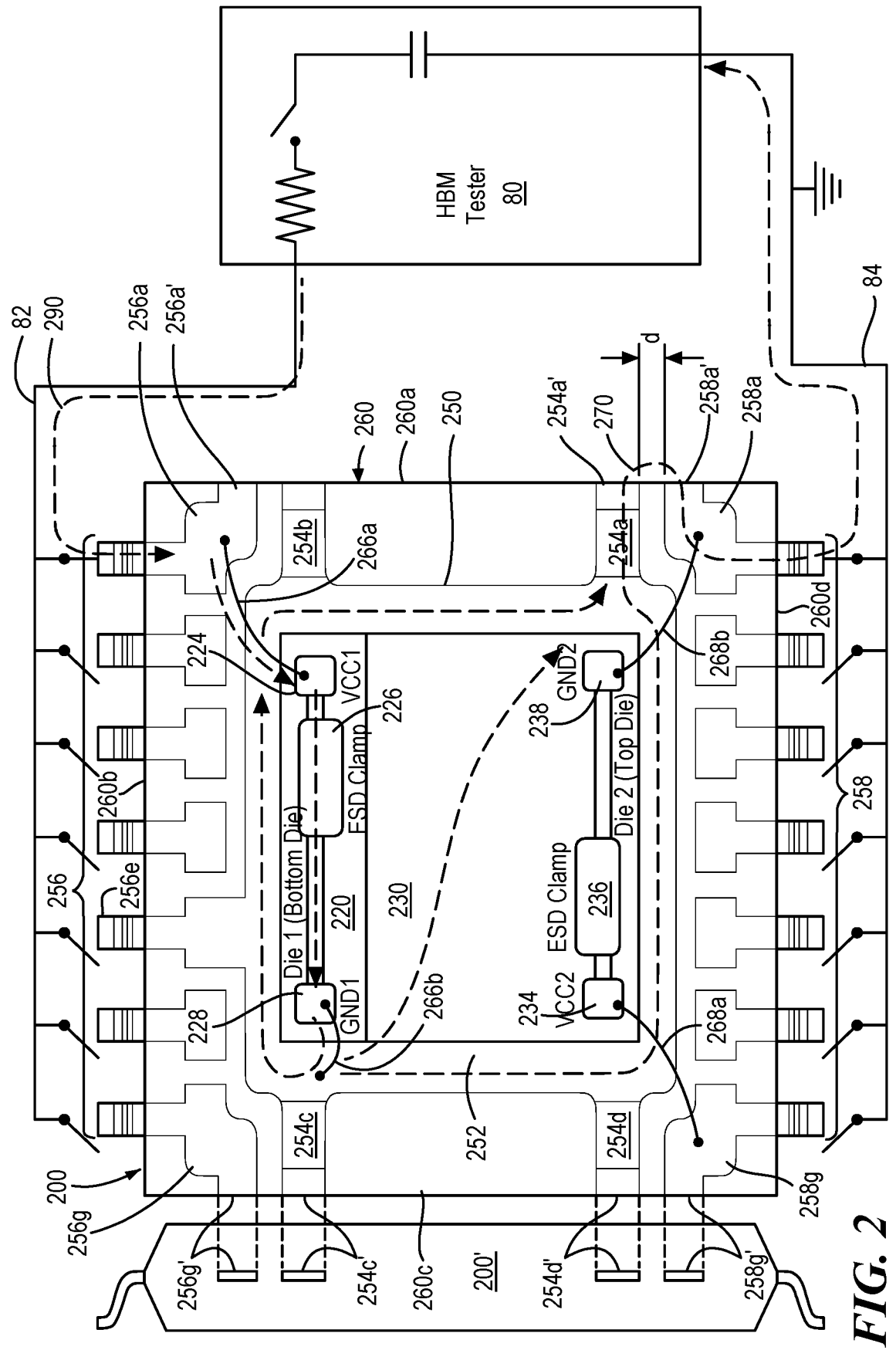
FIG. 2 is a plan view and a side view of an alternative multi-die integrated circuit device including a spark gap according to the disclosure.

Referring to FIG. 2, an alternative multi-die integrated circuit device 200 includes a first die 220 having a first power contact 224 and a first ground contact 228, a second die 230 having a second power contact 234 and a second ground contact 238, and a lead frame 250 including a die attach paddle 252 having a tie bar 254a and leads or pins 256, 258. The first ground contact 228 is electrically coupled to the die attach paddle 252 and the second ground contact 238 is galvanically isolated from the die attach paddle 252. More generally, the first and second die 220, 230 are electrically isolated from each other.

First die 220 can include an ESD clamp 226 between its power and ground contacts 224, 228 and similarly, second die 230 can include an ESD clamp 236, between its power and ground contacts 234, 238, as shown. ESD clamps 226, 236 can be the same as or similar to ESD clamps 26, 36 of FIG. 1.

Device 200 differs from device 10 of FIG. 1 in that the die attach paddle 252 is integrally formed with at least one lead (and here with a lead 256e) as shown. With this unitary die attach paddle and lead arrangement, a direct ground connection is made from the ground contact 228 of the first die 220 to the die attach paddle 252. Thus, a wire bond connection between the first ground contact 228 and the corner lead 256g can be omitted. In other respects, device 200 can be the same as or similar to device 10 of FIG. 1.

Device 200 includes wire bonds 266a, 266b with which electrical connection is made to the first die 220 and wire bonds 268a, 268b with which electrical connection is made to the second die 230. For example, wire bond 266a electrically connects the first power contact 224 to a lead 256a and wire bond 266b electrically connects first ground contact 228 to the die attach paddle 252, as shown. Further, wire bond 268a electrically connects the second power contact 234 to a lead 258g and wire bond 268b electrically connects the second ground contact 238 to a lead 258a.

Device 200 further includes a package body 260 that can be the same as or similar to package body 60 of FIG. 1 and thus, can include a first side 260a, a second side 260b orthogonal to the first side 260a, a third side 260c parallel to the first side 260a, and a fourth side 260d orthogonal to the first side 260a, as shown.

Each of the first plurality of leads 256 extends from the second side 260b of the package body 260 and each of the second plurality of leads 258 extends from the fourth side 260d of the package body.

The tie bar 254a is exposed at the first side 260a of the package body 260.

According to an aspect of the disclosure, a corner lead, such as corner lead 258a of the second plurality of leads 258, is further exposed at the first side 260a of the package body 260 (in addition to being exposed at the fourth side 260d of the package body) in order to form a spark gap 270 between the exposed portion 258a' of the corner lead 258a and the exposed portion 254a' of the tie bar 254a. Spark gap 270 can be the same as or similar to spark gap 70 of FIG. 1.

During testing, tester 80 is selectively connected to device leads 256, 258 by a switchable positive connection 82 and negative or return connection 84 in order to test susceptibility of the device 200 to damage from ESD events. In an illustrated testing example, a positive supply connection 82 is made from the tester 80 to lead 256a and a return connection is made to corner lead 258a. Under test, a high voltage is applied between connections 82, 84 causing a current path 290 (shown by a dotted line) to be formed.

Current path 290 permits current to flow into lead 256a, to the power contact 224, through the ESD clamp 226, out of the first ground connection 228 to the die attach paddle 252 (here through wire bond 266b). From the die attach paddle 252, current flows to the tie bar 254a, through the spark gap 270 (i.e., out of the exposed portion 254a' of tie bar 254a, through air external to the package body 260 and back into the package at adjacent exposed portion 258a' of corner lead 258a), through pin 258a, and back to the tester 80.

With this arrangement, a current path external to the integrated circuit device 200 is provided by the spark gap 270 through which current can flow under certain ESD types of conditions.

Distance "d" between the exposed portion 258a' of the corner lead 258a and the exposed portion 254a' of the tie bar 254a along the first side 260a of the package body 260 is designed based on predetermined voltage isolation requirements.

Additional corner leads of device 200 can include a corner lead 256a that has an exposed portion 256a' from the first side 260a of the package body 260, a corner lead 256g that has an exposed portion 256g' from the third side 260c of the package body 260, and a corner lead 258g that has an exposed portion 258g' from the third side 260c of the package body, as shown.

Lead frame 250 can include a second tie bar 254b exposed at the first side 260a of the package body, a third tie bar 254c exposed at the third side 260c of the package body, and a fourth tie bar 254d exposed at the third side 260c of the package body, as shown.

Four tie bars 254a, 254b, 254c, 254d can be used in the example device 200 for ease of manufacturability and balance. Providing tie bars 254a, 254b, 254c, 254d adjacent to respective exposed portions 256a', 256g', 258a', 258g' of respective corner leads 256a, 256g, 258a, 258g provides flexibility in the device design to provide additional or alternative spark gaps to spark gap 270 (not labeled).

Also shown in FIG. 2 is a side view 200' of the device 200 from which the exposed portion 256g', 258g' of respective corner leads 256g, 258g and the exposed portion 254c', 254d' of respective tie bars 254c, 254d can be seen.

Like device 10 of FIG. 1, device 200 can contain various electronic components and circuitry to implement various functionality, such as sensor functionality using one or more sensing elements, in combination with other circuits. Die 220, 230 can be redundant to achieve safety requirements.

Like device 10 of FIG. 1, device 200 can be provided in a "stacked" configuration in which the die vertically overlap one another, as shown.

Figure 3:
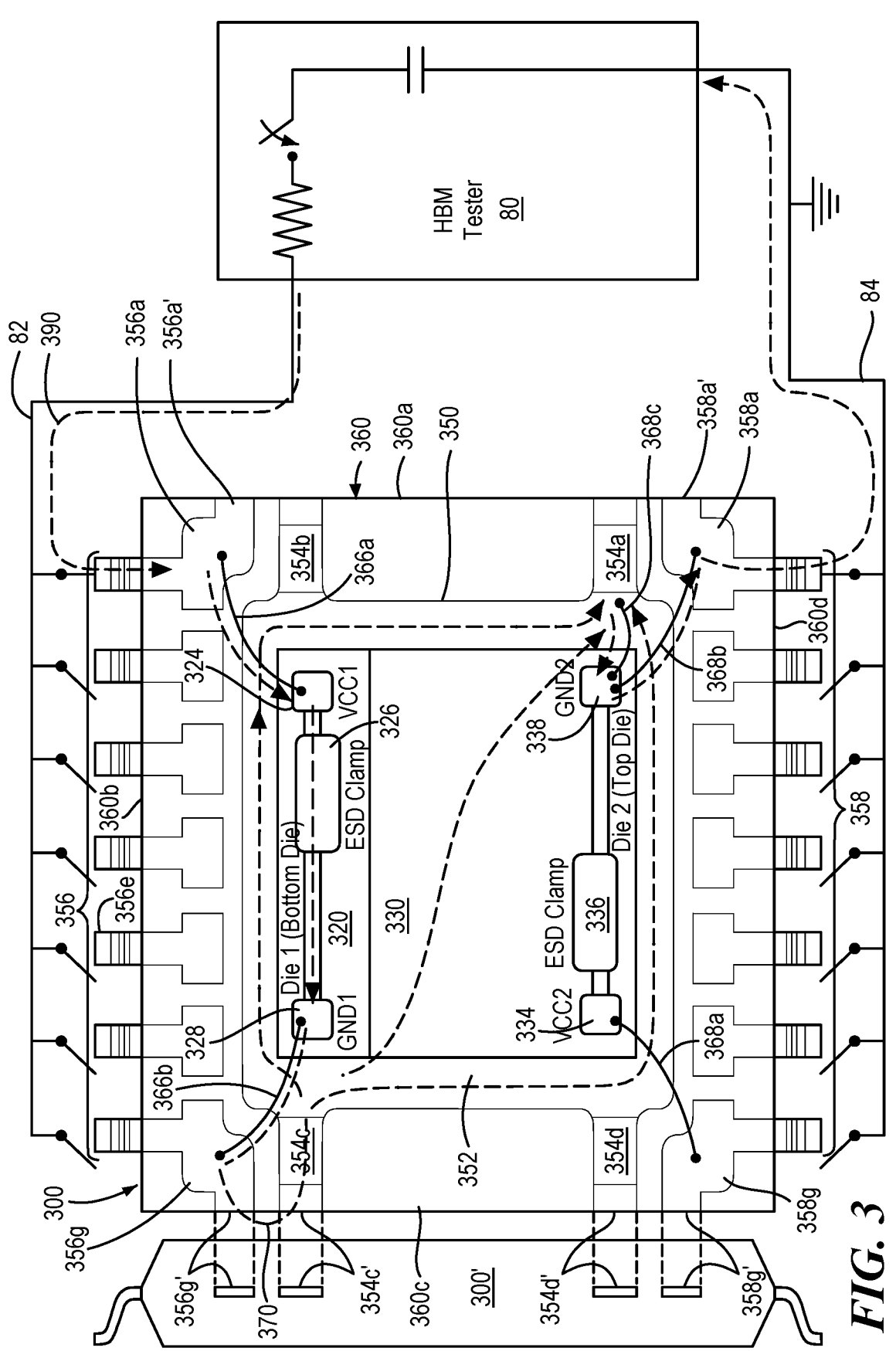
FIG. 3 is a plan view and a side view of a further alternative multi-die integrated circuit device including a spark gap according to the disclosure.

Referring to FIG. 3, as another alternative to device 10 of FIG. 1, in some embodiments, the ground contact of the top die (rather than the ground contact of the bottom die) is connected to the die attach paddle. To this end, a multi-die integrated circuit device 300 includes a first die 320 having a first power contact 324 and a first ground contact 328, a second die 330 having a second power contact 334 and a second ground contact 338, and a lead frame 350 including a die attach paddle 352 having a tie bars 354a, 354b, 354c, 354d and leads or pins 356, 358. The second ground contact 338 is electrically coupled to the die attach paddle 352 and the first ground contact 328 is galvanically isolated from the die attach paddle 352.

In other respects, device 300 can be the same as or similar to device 10 of FIG. 1. Thus, first die 320 can include an ESD clamp 326 between its power and ground contacts 324, 328 and similarly, second die 330 can include an ESD clamp 336, between its power and ground contacts 334, 338, as shown, which ESD clamps 326, 336 can be the same as or similar to ESD clamps 26, 36 of FIG. 1.

Device 300 includes wire bonds 366a, 366b with which electrical connection is made to the first die 320 and wire bonds 368a, 368b, 368c with which electrical connection is made to the second die 330. For example, wire bond 366a electrically connects the first power contact 324 to a lead 356a and wire bond 366b electrically connects first ground contact 328 to a lead 356g, as shown. Further, wire bond 368a electrically connects the second power contact 334 to a lead 358g, wire bond 368b electrically connects the second ground contact 338 to a lead 358a, and wire bond 368c electrically connects the second ground contact 338 to the die attach paddle 352.

Device 300 further includes a package body 360 that can be the same as or similar to package body 60 of FIG. 1 and thus, can include a first side 360a, a second side 360b orthogonal to the first side 360a, a third side 360c parallel to the first side 360a, and a fourth side 360d orthogonal to the first side 360a, as shown.

Each of the first plurality of leads 356 extends from the second side 360b of the package body 360 and each of the second plurality of leads 358 extends from the fourth side 360d of the package body. Further, corner leads of device 300 are additionally exposed from the first side 360a and the third side 360c of the package body 360. Corner lead 356a has an exposed portion 356a' from the first side 360a of the package body 360, corner lead 358a has an exposed portion 358a' from the first side 360a of the package body 360, corner lead 356g that has an exposed portion 356g' from the third side 360c of the package body 360, and corner lead 358g that has an exposed portion 358g' from the third side 360c of the package body 360, as shown.

According to an aspect of the disclosure, a spark gap 370 is provided between the exposed portion 356g' of the corner lead 356g and the exposed portion 354c' of the tie bar 354c. Spark gap 370 can be the same as or similar to spark gap 70 of FIG. 1.

During testing, tester 80 is selectively connected to device leads 356, 358 by a switchable positive connection 82 and negative or return connection 84 in order to test susceptibility of the device 300 to damage from ESD events. In an illustrated testing example, a positive supply connection 82 is made from the tester 80 to lead 356a and a return connection is made to corner lead 358a. Under test, a high voltage is applied between connections 82, 84 causing a current path 390 (shown by a dotted line) to be formed. Current path 390 permits current to flow into lead 356a, to the power contact 324, through the ESD clamp 326, out of the first ground connection 328 to corner lead 356g (here through wire bond 366b), through spark gap 370 (i.e., out of the exposed portion 356g' of corner lead 356g, through air external to the package body 360 and back into the package at adjacent exposed portion 354c' of tie bar 354c), through die attach paddle 352, ground contact 338, to corner pin 358a, and back to the tester 80.

With this arrangement, a current path external to the integrated circuit device 300 is provided by the spark gap 370 through which current can flow under certain ESD types of conditions.

Also shown in FIG. 3 is a side view 300' of the device 300 from which the exposed portion 356g', 358g' of respective corner leads 356g, 358g and the exposed portion 354c', 354d' of respective tie bars 354c, 354d can be seen.

Like device 10 of FIG. 1, device 300 can contain various electronic components and circuitry to implement various functionality, such as sensor functionality using one or more sensing elements, in combination with other circuits. Die 320, 330 can be redundant to achieve safety requirements.

Like device 10 of FIG. 1, device 300 can be provided in a "stacked" configuration in which the die vertically overlap one another, as shown.

Figure 4:
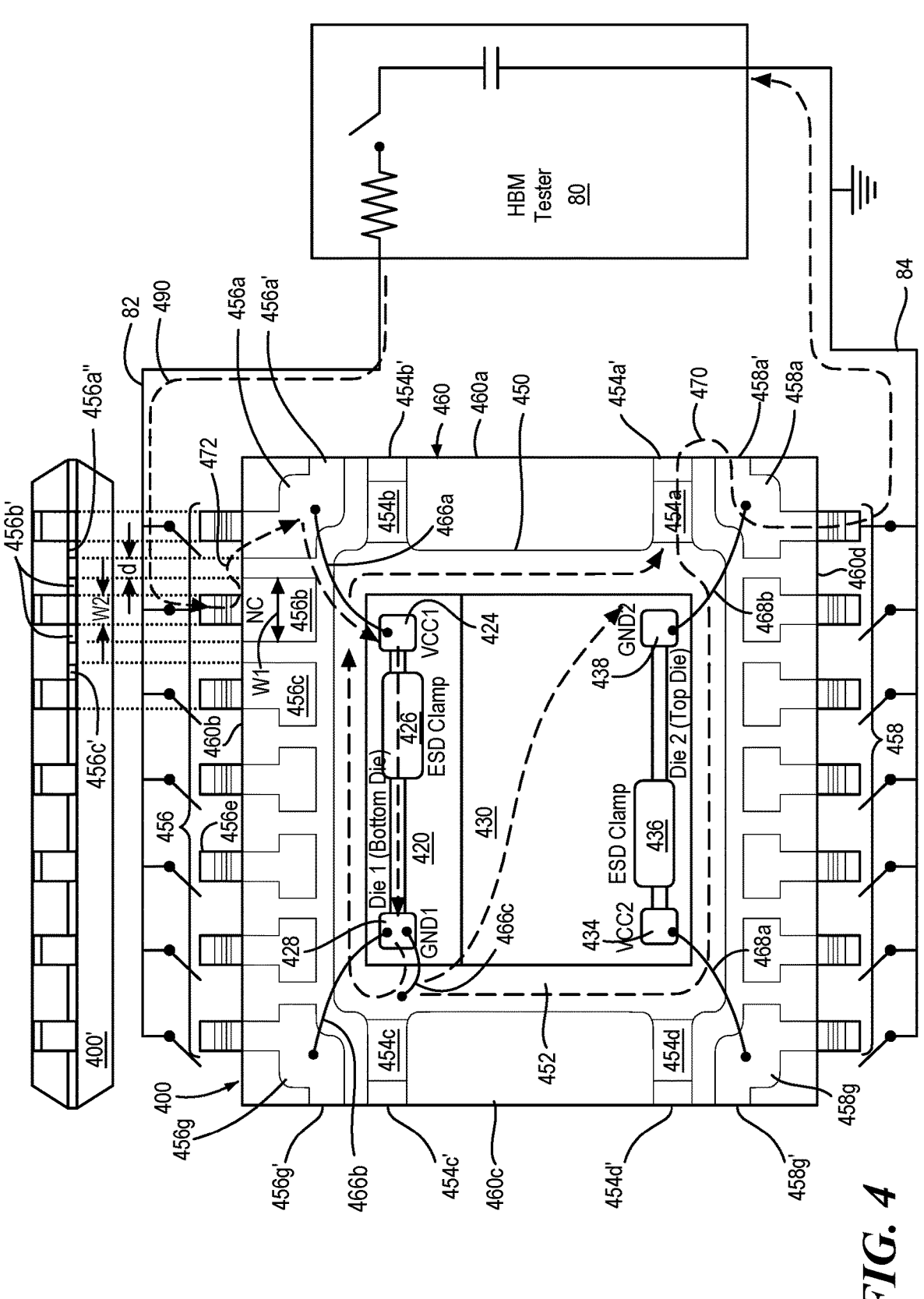
FIG. 4 is a plan view and a side view of an alternative multi-die integrated circuit device including an additional spark gap according to the disclosure.

Referring also to FIG. 4, according to a further aspect of the disclosure, an alternative or additional spark gap can be formed between adjacent leads of an integrated circuit device 400. According to some HBM testing requirements, device packages with less than six pins or leads require that pins configured as "no connect" pins (i.e., pins that are not electrically connected to device components) are included in the pin groups stressed during ESD testing. Stressing "no connect" pins can cause random arcing that could potentially damage device 400 and or the HBM tester 80. To address this issue, one or more spark gaps between adjacent leads can be provided.

Multi-die integrated circuit device 400 includes a first die 420 having a first power contact 424 and a first ground contact 428, a second die 430 having a second power contact 434 and a second ground contact 438, and a lead frame 450 including a die attach paddle 452 having tie bars 454a, 454b, 454c, 454d and leads or pins 456, 458. The first ground contact 428 is electrically coupled to the die attach paddle 452 and the second ground contact 438 is galvanically isolated from the die attach paddle 452.

First die 420 can include an ESD clamp 426 between its power and ground contacts 424, 428 and similarly, second die 430 can include an ESD clamp 436, between its power and ground contacts 434, 438, which ESD clamps 426, 436 can be the same as or similar to ESD clamps 26, 36 of FIG. 1.

Device 400 includes wire bonds 466a, 466b, 466c with which electrical connection is made to the first die 420 and wire bonds 468a, 468b with which electrical connection is made to the second die 430. For example, wire bond 466a electrically connects the first power contact 424 to a lead 456a, wire bond 466b electrically connects first ground contact 428 to a lead 456g, and wire bond 466c electrically connects the first ground contact 428 to the die attach paddle 452, as shown. Further, wire bond 468a electrically connects the second power contact 434 to a lead 458g and wire bond 468b electrically connects the second ground contact 438 to a lead 458a.

Device 400 further includes a package body 460 that can be the same as or similar to package body 60 of FIG. 1 and thus, can include a first side 460a, a second side 460b orthogonal to the first side 460a, a third side 460c parallel to the first side 460a, and a fourth side 460d orthogonal to the first side 460a, as shown.

Each of the first plurality of leads 456 extends from the second side 460b of the package body 460 and each of the second plurality of leads 458 extends from the fourth side 460d of the package body.

Tie bars 454a, 454b, 454c, 454d are exposed from sides of the package body 460 at respective exposed portions 454a', 454b', 454c', 454d' so as to permit spark gaps to adjacent exposed portions 458a', 456a', 456g', 458g' of respective corner leads 458a, 456a, 456g, 458g, as shown. For example, corner lead 458a in conjunction with tie bar 454a form a spark gap 470 between the exposed portion 458a' of the corner lead 458a and the exposed portion 454a' of the tie bar 454a.

Additionally, one or more "no connect" leads, for example "no connect" lead 456b and its adjacent leads 456a, 456c have exposed portions 456a", 456b', 456c' along a side 460b of the package body 460 designed to form a spark gap 472. A distance "d" between the exposed portion 456b' of "no connect" lead 456b and the exposed portions 456a", 456c' of its respective adjacent leads 456a, 456c is based on predetermined voltage isolation requirements. In the example embodiment, a width "w1" of the exposed portion 456b' of "no connect" lead 456b is larger than a width "w2" or the portion of the lead that extends beyond the side 460b of the package, as shown.

During testing, tester 80 is selectively connected to device leads 456, 458 by a switchable positive connection 82 and negative or return connection 84 in order to test susceptibility of the device 400 to damage from ESD events. In an illustrated testing example of "no connect" pin testing, a positive supply connection 82 is made from the tester 80 to lead 456b and a return connection is made to corner lead 458a. Under test, a high voltage is applied between connections 82, 84 causing a current path 490 (shown by a dotted line) to be formed. Current path 490 permits current to flow into "no connect" lead 456b and out of the lead 456b to adjacent lead 456a through a spark gap 472. From lead 456a, current flows to the power contact 424, through the ESD clamp 426, out of the first ground connection 428 to the die attach paddle 452 (here through wire bond 466c). From the die attach paddle 452, current flows to the tie bar 454a, through the spark gap 470, through pin 458a, and back to the tester 80.

With this arrangement, a current path external to the integrated circuit device 400 from a "no connect" lead to an adjacent lead is provided by the spark gap 472 through which current can flow under certain ESD types of conditions. Also the current path from tie bar 454a to adjacent corner lead 458a is provided by the spark gap 470.

Also shown in FIG. 4 is a side view 400' of the device 400 from which the exposed portions 456a", 456b', 456c' of respective leads 456a, 456b, 456c can be seen.

Like device 10 of FIG. 1, device 400 can contain various electronic components and circuitry to implement various functionality, such as sensor functionality using one or more sensing elements, in combination with other circuits. Die 420, 430 can be redundant to achieve safety requirements.

Like device 10 of FIG. 1, device 400 can be provided in a "stacked" configuration in which the die vertically overlap one another, as shown.

It will be appreciated by those of ordinary skill in the art that the spark gap 472 between adjacent leads 456a, 456b can be an additional spark gap to the spark gap 470 between a tie bar and exposed corner lead or can be used in a device that does not also include spark gap 470.

Figure 5:
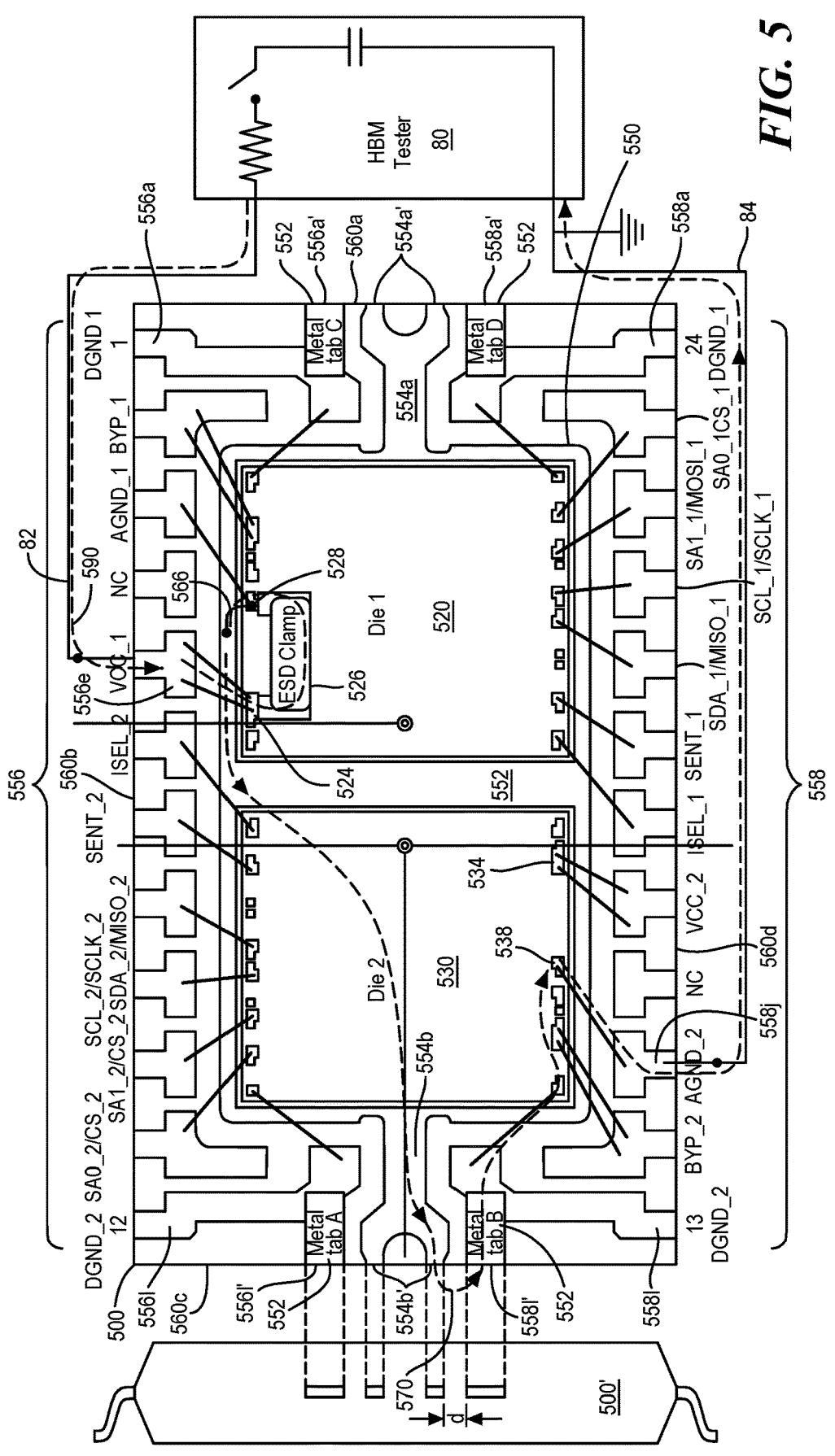
FIG. 5 is a plan view and a side view of another alternative multi-die integrated circuit device including a spark gap according to the disclosure.

Referring to FIG. 5, a multi-die device 500 includes a first die 520 and a second die 530 in a side-by-side configuration and a spark gap 570. First die 520 has a first power contact 524 and a first ground contact 528, second die 530 has a second power contact 534 and a second ground contact 538, and a lead frame 550 includes a die attach paddle 552 having tie bars 554a, 554b and leads or pins 556, 558.

The first ground contact 528 is electrically coupled to the die attach paddle 552, here by a wire bond 566, and the second ground contact 538 is galvanically isolated from the die attach paddle 552. More generally, the first and second die 520, 530 are electrically isolated from each other. Additional wire bonds (not labeled) can be provided to electrically connect die 520, 530 to pins 556, 558, as shown.

First die 520 can include an ESD clamp 526 between its power and ground contacts 524, 528, as shown, which ESD clamp can be the same as or similar to ESD clamps 26, 36 of FIG. 1.

Device 500 further includes a package body 560 that can be the same as or similar to package body 60 of FIG. 1 and thus, can include a first side 560a, a second side 560b orthogonal to the first side 560a, a third side 560c parallel to the first side 560a, and a fourth side 560d orthogonal to the first side 560a, as shown.

Each of the first plurality of leads 556 extends from the second side 560b of the package body 560 and each of the second plurality of leads 558 extends from the fourth side 560d of the package body.

Tie bar 554a is exposed at the first side 560a of the package body 560 and tie bar 554b is exposed at the third side 560c of the package body 560. Tie bars 554a, 554b can have fork-shaped ends as shown so that each tie bar is exposed from the respective package body side at two exposed portions 554a', 554b'.

Corner leads 556a, 558a are further exposed at the first side 560a of the package body 560 (in addition to being exposed at the second side 560b and the fourth side 560d of the package body, respectively) and corner leads 556l, 558l are further exposed at the third side 560c of the package body 560 (in addition to being exposed at the second side 560b and the fourth side 560d of the package body, respectively). More particularly, tabs 552, as may be metal tabs, are electrically connected to corner leads 556a, 558a and terminate at package body side 560a to provide exposed portions 556a', 558a' of these corner leads. Similarly, tabs 552 are electrically connected to corner leads 556l, 558l and terminate at package body side 560c to provide exposed portion 556l', 558l' of these corner leads.

With this arrangement, a spark gap 570, is formed between an exposed portion 558l' of the corner lead 558l and an adjacent exposed portion 554b' of the tie bar 554b. Spark gap 270 can be the same as or similar to spark gap 70 of FIG. 1.

During testing, tester 80 is selectively connected to device leads 556, 558 by a switchable positive connection 82 and negative or return connection 84 in order to test susceptibility of the device 500 to damage from ESD events. In an illustrated testing example, a positive supply connection 82 is made from the tester 80 to lead 556e and a return connection is made to corner lead 558j. Under test, a high voltage is applied between connections 82, 84 causing a current path 590 (shown by a dotted line) to be formed. Current path 590 permits current to flow into lead 556e, to the power contact 524, through the ESD clamp 526, out of the first ground connection 528 to the die attach paddle 552 (here through wire bond 566). From the die attach paddle 552, current flows to the tie bar 554b, through the spark gap 570 (i.e., out of the exposed portion 554b' of tie bar 554b, through air external to the package body 560 and back into the package at adjacent exposed portion 558l' of corner lead 558l), in and out of die 530, and through pin 558j, and back to the tester 80.

With this arrangement, a current path external to the integrated circuit device 500 is provided by the spark gap 570 through which current can flow under certain ESD types of conditions.

Distance "d" between the exposed portion 554b' of tie bar 554b and the exposed portion 558l' of the corner lead 558l along the third side 560c of the package body 560 is designed based on predetermined voltage isolation requirements.

Also shown in FIG. 5 is a side view 500' of the device 500 from which the exposed portion 556l', 558l' of respective corner leads 556l, 558l and the exposed portion 554b' of tie bar 554b can be seen.

Like device 10 of FIG. 1, device 500 can contain various electronic components and circuitry to implement various functionality, such as sensor functionality using one or more sensing elements, in combination with other circuits. Die 520, 530 can be redundant to achieve safety requirements.

Unlike the "stacked" configuration of device 10 of FIG. 1 in which the die vertically overlap one another, the side-by-side configuration of device 500 has each die 520, 530 attached to the die attach pad 552. To this end, a non-conductive, electrically insulative adhesive can be provided between the first die 520 and die attach paddle 552 and also between the second die 530 and the die attach paddle 552.

As used herein, the term "magnetic field sensing element" is used to describe a variety of electronic elements that can sense a magnetic field. The magnetic field sensing element can be, but is not limited to, a Hall effect element, a magnetoresistance element, a magnetotransistor, or an inductive coil. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship. As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. Apparatus comprising:

a first die having a first power contact and a first ground contact;

a second die having a second power contact and a second ground contact;

a lead frame comprising a die attach paddle, a tie bar, and a plurality of leads, wherein the first ground contact is electrically coupled to the die attach paddle and the second ground contact is galvanically isolated from the die attach paddle; and a package body enclosing the die attach paddle, the first die, and the second die, wherein the tie bar is exposed at a first side of the package body and each of the plurality of leads is exposed at a second side of the package body orthogonal to the first side, wherein a corner lead of the plurality of leads is exposed at the first side of the package body to form a spark gap between the exposed portion of the corner lead and the exposed portion of the tie bar.

2. The apparatus of claim 1 wherein a distance between the exposed portion of the corner lead and the exposed portion of the tie bar along the first side of the package body is selected based on a predetermined voltage isolation.

3. The apparatus of claim 1 wherein the tie bar is a first tie bar and wherein the die attach paddle comprises a second tie bar exposed at the first side of the package body, a third tie bar exposed at a third side of the package body opposite to the first side of the package body, and a fourth tie bar exposed at the third side of the package body.

4. The apparatus of claim 1 wherein the plurality of leads comprises a first plurality of leads and wherein the apparatus further comprises a second plurality of leads, each exposed at a fourth side of the package body opposite to the second side of the package body.

5. The apparatus of claim 1 further comprising a first wire bond with which the first ground contact is electrically coupled to the die attach paddle and a second wire bond with which the first ground contact is electrically coupled to a lead of the plurality of leads.

6. The apparatus of claim 1 further comprising a first wire bond with which the first ground contact is electrically coupled to the die attach paddle, wherein the lead frame comprises a die attach paddle extension extending between the die attach paddle and a lead of the plurality of leads.

7. The apparatus of claim 1 wherein the first die is attached to the die attach paddle and the second die is attached to the first die in a stacked arrangement.

8. The apparatus of claim 7 further comprising a non-conductive adhesive between the first die and the die attach paddle and between the first die and the second die.

9. The apparatus of claim 1 wherein the second die is attached to the die attach paddle and the first die is attached to the second die in a stacked configuration.

10. The apparatus of claim 1 wherein the first die is attached to the die attach paddle and the second die is attached to the die attach paddle so that the first die and the second die are in a side-by-side configuration.

11. The apparatus of claim 10 further comprising a non-conductive adhesive between the first die and the die attach paddle and between the second die and the die attach paddle.

12. The apparatus of claim 1 wherein the first die and the second die are substantially identical.

13. The apparatus of claim 1 wherein at least one of the plurality of leads that is not electrically connected to the first die or to the second die comprises a first portion enclosed by the package body and a second portion exposed outside of the package body, wherein the first portion is wider than the second portion to form a second spark gap to an adjacent lead of the plurality of leads.

14. The apparatus of claim 13 wherein the at least one lead has a T-shape.

15. The apparatus of claim 1 wherein the corner lead comprises a first portion formed from lead frame material and a second tab portion extending from the first portion to the first side of the package body.

16. Apparatus comprising:
   a first die having a first power contact and a first ground contact;
   a second die having a second power contact and a second ground contact;
   a lead frame comprising a die attach paddle having a tie bar and a plurality of leads, wherein the first ground contact is electrically coupled to the die attach paddle and the second ground contact is galvanically isolated from the die attach paddle; and
   a package body enclosing the die attach paddle, the first die, and the second die, wherein at least one of the plurality of leads that is not electrically connected to the first die or to the second die comprises a first portion enclosed by the package body and a second portion exposed outside of the package body, wherein the first portion is wider than the second portion to form a spark gap to an adjacent lead of the plurality of leads.

17. The apparatus of claim 16 wherein the at least one lead has a T-shape.

18. The apparatus of claim 16 wherein the die attach paddle comprises a tie bar exposed at a first side of the package body and each of the plurality of leads is exposed at a second side of the package body orthogonal to the first side, wherein a corner lead of the plurality of is exposed at the first side of the package body to form a spark gap between the exposed portion of the corner lead and the exposed portion of the tie bar.

19. A method for protecting a multi-die electronic device from electrostatic discharge comprising:
   providing a lead frame with a die attach paddle, a tie bar, and a plurality of leads;
   attaching first and second die to the die attach paddle of the lead frame;
   electrically coupling a ground contact of the first die to the die attach paddle and galvanically isolating the second die from the first die;
   enclosing the first die, the second die, and the die attach paddle with a package body having a first side along where each of the plurality of leads is exposed; and
   exposing the tie bar and a corner lead of the plurality of leads along a second side of the package body orthogonal to the first side.

* * * * *